United States Patent [19]

Kadakia et al.

[11] Patent Number: 5,361,339

[45] Date of Patent: Nov. 1, 1994

[54] CIRCUIT FOR FAST PAGE MODE ADDRESSING OF A RAM WITH MULTIPLEXED ROW AND COLUMN ADDRESS LINES

[75] Inventors: Vinod K. Kadakia, Rancho Palos Verdes; Christine H. Kang, Los Angeles, both of Calif.

[73] Assignee: Xerox Corporation, Stamford, Conn.

[21] Appl. No.: 878,192

[22] Filed: May 4, 1992

[51] Int. Cl.⁵ .................. G06F 12/00; G11C 8/00; G09G 5/38

[52] U.S. Cl. .............. 395/400; 364/DIG. 1; 345/126; 345/200; 365/230.02; 365/236

[58] Field of Search ............. 395/400, 425, 164, 165, 395/166; 365/230.02, 230.03, 236; 345/200, 126

[56] References Cited

U.S. PATENT DOCUMENTS

| | | | |
|---|---|---|---|
| 4,500,958 | 2/1985 | Manton et al. | 395/425 |
| 4,554,638 | 11/1985 | Iida | 395/166 |
| 4,965,751 | 10/1990 | Thayer et al. | 345/200 |
| 5,012,434 | 4/1991 | Zietlow | 395/148 |
| 5,068,904 | 11/1991 | Yamazaki | 382/46 |
| 5,111,192 | 5/1992 | Kadakia | 345/126 |
| 5,289,279 | 2/1994 | Braun et al. | 345/200 |

Primary Examiner—Glenn Gossage
Attorney, Agent, or Firm—Robert Cunna

[57] ABSTRACT

A circuit for addressing a random access memory (RAM) and for rotating an image by reading it into and then out from a page buffer, where all transfers, whether by column or row, are performed substantially in a fast page mode in which the same row address is maintained from one access to the next. The column address lines of RAM devices are connected to the 5 or 6 least significant bits of the vertical and horizontal address counters of the image, and the row address lines are connected to the remaining most significant bits of the vertical and horizontal counters of the image. Therefore, whether the system is accessing the image data in the vertical or horizontal direction, there will be at least 31 fast page mode accesses for every one slow access, and the average speed of transfers in either direction will approximate the fast page mode speed.

1 Claim, 5 Drawing Sheets

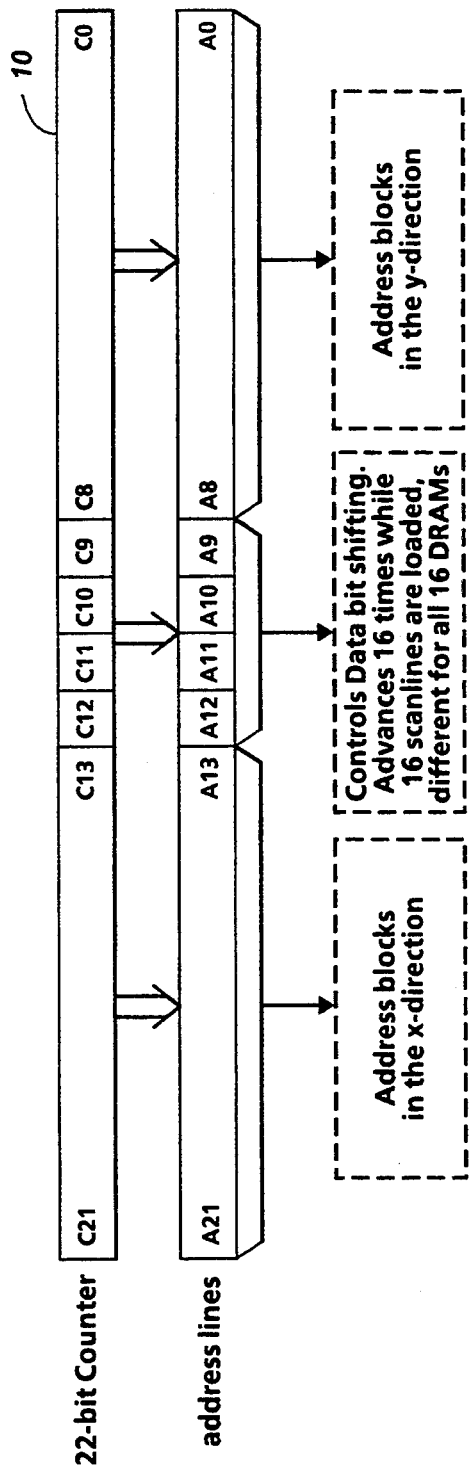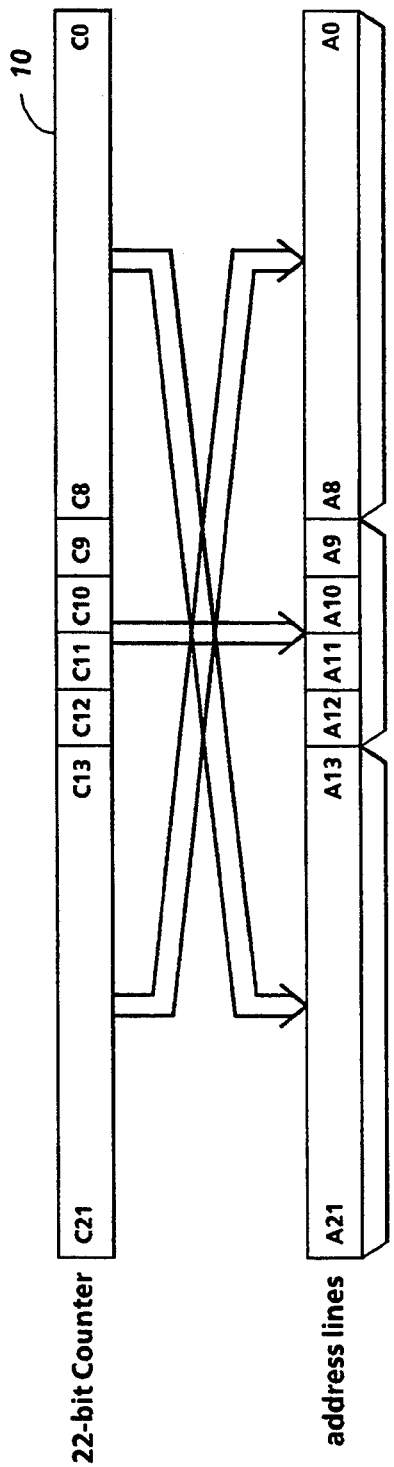

CIRCUIT FOR FAST PAGE MODE ADDRESSING OF A RAM WITH MULTIPLEXED ROW AND COLUMN ADDRESS LINES

BACKGROUND OF THE INVENTION

This invention is directed to an improved circuit for rotating a digital image any multiple of 90 degrees by bit shifting the lines of an image, storing them into a buffer memory, reading them out in a different order and bit shifting again, almost all of the transfers to and from memory being in the fast page mode.

The basic circuit has been described in U.S. patent application Ser. No. 07/453,738, Method To Rotate a Bitmap 90 Degrees, now U.S. Pat. No. 5,111,192, and a more detailed description of the addressing details is contained in application Ser. No. 07/721,797, Parallel Rotation Algorithm, both of which are incorporated by reference herein.

The basic system of rotating a block of an image requires first that each line of each block of the image be circularly shifted by the line number within the block and then stored in a buffer memory. For example, line 0 is circularly shifted 0 bits, line 1 is circularly shifted 1 bit, etc. At this point, the image can either be read out of the buffer and not rotated at all, or read out in such a way that the final image is rotated by any multiple of 90 degrees, including all mirror images.

To get back the original orientation, the image is read out one line at a time, and is simply shifted back to its original form. To get a rotated image, the image block is read out from the buffer along diagonal lines, and circularly shifted again.

When reading in image data to the buffer, the fast page mode can be used. This is a feature designed into memory devices, and provides that the data can be stored or read out at a higher speed provided that the row address does not change from one access to the next. For example, when reading words into a buffer, assume that the data is read into row 0 col 0, row 0 col 1, row 0 col 2, etc. Since the row address does not change, the fast page mode can be used, and the total data transfer can be done in a fraction of the time that it would otherwise take. The column addresses need not be sequential, as long as the row address is constant.

Similarly, to take data out of the buffer in non-rotated form, the procedure is simply the reverse of the loading procedure, and that can also be handled in the fast page mode.

The problem occurs when reading from the buffer in the rotation mode. Here the bits are taken from row 0 col 0, then row 1 col 0, then row 2 col 0, etc. Here the fast page mode can not be used because the row address is different for each read, and therefore the production of a rotated image will take significantly longer than the production of one that is not rotated. There is a need, therefore, for an improved circuit that will produce both rotated and unrotated images at speeds approximating that of the fast page mode.

SUMMARY OF THE INVENTION

At a typical printer, as an image is being received, a word counter keeps track of the number of words, and will finally contain the total count of words in the image. For example, when a rectangular image is being received with its scan lines in the vertical direction, typically the least significant half of the counter is used to address the image in the vertical direction and the most significant half of the counter to address the image in the horizontal direction. This image is temporarily stored in a page buffer comprising memory devices having column and row address lines. Typically, the least significant half of the image counter, which addresses the image in the vertical direction, is connected to the column address lines of the memory devices, and the most significant half of the image counter, which addresses the image in horizontal direction, to the row address lines of the memory device. The result is that if the data is read out from the buffer in the vertical direction (the data is read out from the buffer in the same way as it was stored) fast page mode can be used but if the data is read out in the horizontal direction (the data is read out from the buffer in a 90 degree rotated direction) the fast page mode can not be used.

The central concept of this invention is to connect half of the least significant bits of the address for the image in the vertical direction and half of the least significant bits of the address for the image in the horizontal direction to the column address pins of the memory devices of the page buffer. Similarly, the other half of the address for the image in the vertical and horizontal directions are connected to the row address pins of the buffer. Now, whether the system is stepping through the image in the vertical or horizontal direction, it will be able to get through a number of fast page mode reads before having to use one slow page mode read.

To use a numerical example, assume a prior art buffer memory which uses 16 devices to store 512 words (16 bits per word) by 8K lines. In this case the word counter, which uses 22 bits to count the input words, will use the least significant 9 bits of the counter to address the image in the vertical direction, and the most significant 13 bits of the counter to address the image in the horizontal direction. Typically, the least significant half of the image counter is connected to the column address lines of the memory device, and the other half to the row address lines. Thus, fast page mode can only be used in one direction, when the data is accessed in the vertical direction.

In contrast, this invention uses the least significant 6 bits of the counter to address the image in the vertical direction and the least significant 5 bits of the counter to address the image in the horizontal direction as column address inputs of the memory devices of the page buffer. Similarly, all of the remaining most significant bits of the addresses for the vertical direction and horizontal direction are connected to the row address lines of the memory devices of the page buffer.

Now, when data is stored or read out in vertical scanlines (no 90 degree rotation), there can be 63 readouts (for 6 address lines) in the fast page mode before there will be a bit change in the row address of the memory device, and one slow page mode readout will be necessary for that one read. Then the system goes back to another 63 fast reads. Similarly, if the memory is being read out in the horizontal direction (90 degree rotation), there can be 31 readouts (for 5 address lines) in the fast page mode before there will be a bit change in row address, and one slow page mode readout will be necessary for that one read. Then the system goes back to another 31 fast reads. In either case the average readout speed will be almost equal to the fast mode speed. In this way, speeds approaching the fast page mode are available whether the read out is in the vertical or horizontal direction of the image, and therefore whether the image is being rotated or not.

BRIEF DESCRIPTION OF THE DRAWINGS

FIG. 3 is the prior art method of addressing the page buffer during loading.

FIG. 5 is the prior art method of addressing the page buffer while reading out a rotated image.

DETAILED DESCRIPTION OF THE INVENTION

Figure 1:
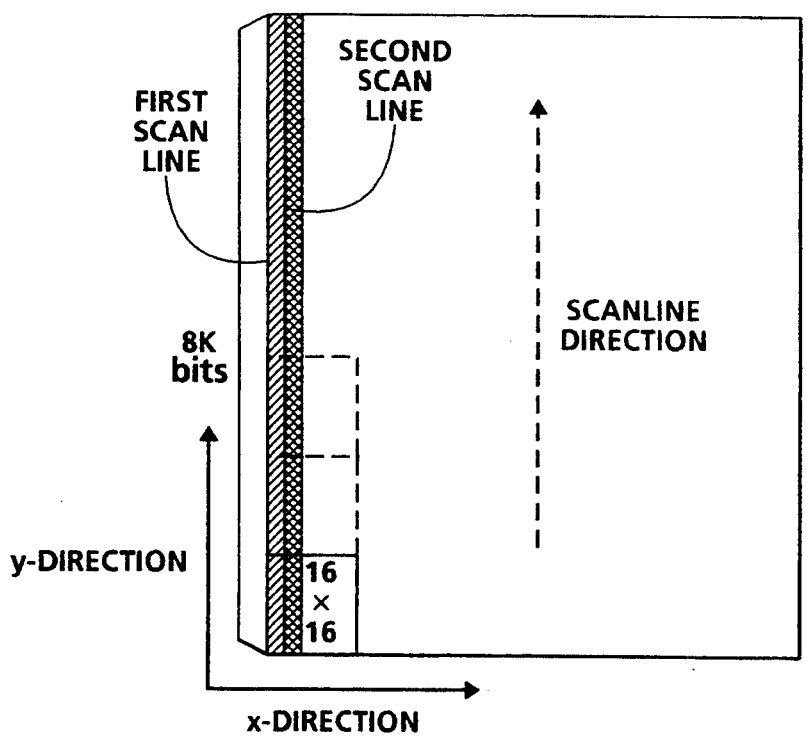
FIG. 1 is a diagram of the original image.

The original image is shown in FIG. 1. Each scanline is made up of 512 words of 16 bits each, for a total of 8K bits, and there are 8K scan lines in the page. In FIG. 1, the first scanline is shown in black and the second scanline is shown as crosshatched. Thus there are 8K vertical rows and 512 horizontal columns in the image. These are then grouped into 16 by 16 bit blocks as shown.

Figure 2:
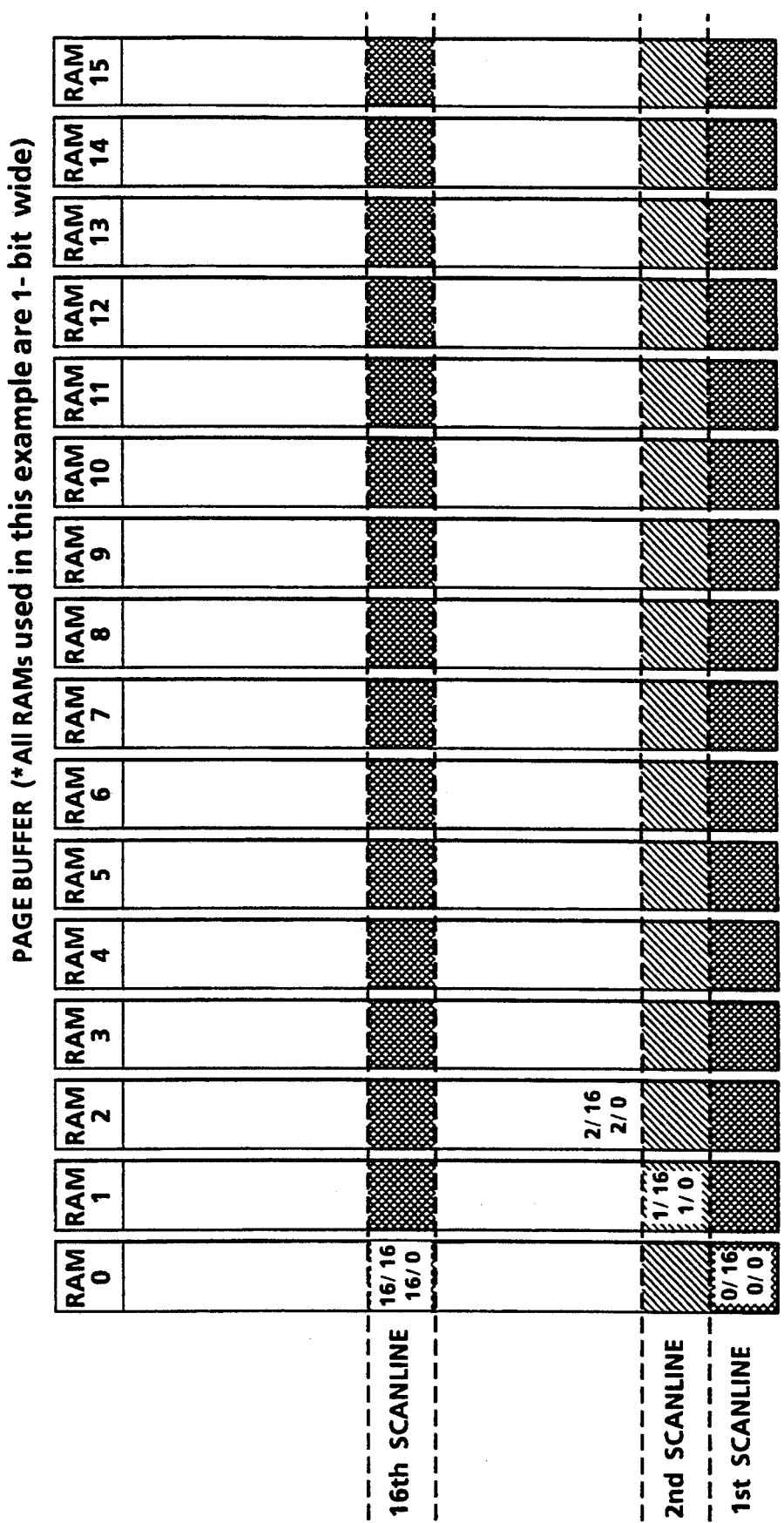
FIG. 2 is shows how the image is loaded into the buffer memory in the prior art.

FIG. 2 shows how these lines are loaded into a page buffer arranged according to the prior art. Each scan line is shifted if necessary, and then loaded into 512 words of the buffer as shown. The result is one row for each scan line.

Figure 4:
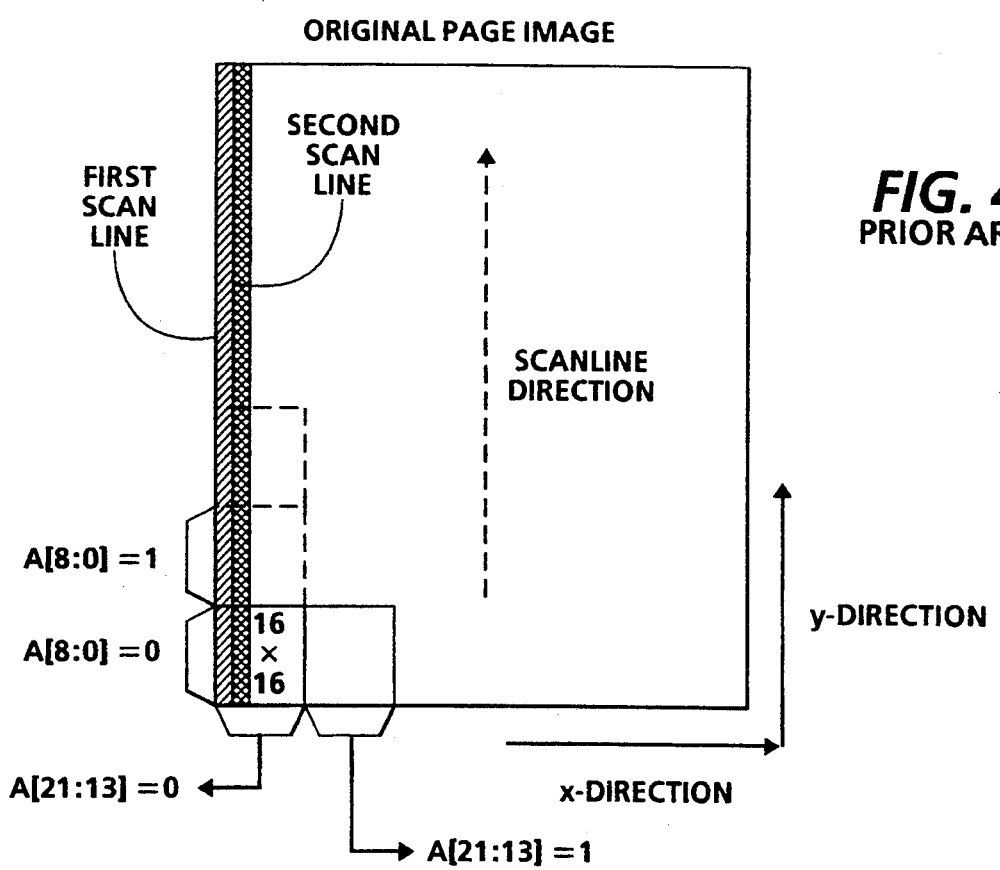
FIG. 4 is the arrangement of data in the page buffer.

To read out in unrotated form, the data is read out as it was stored and then shifted back to reproduce the original image. This prior art system for loading or reading is shown in FIGS. 3 and 4. The 8K by 8K buffer is segmented into 16 bit words and there are a total of 4,194,304 words, which requires a 22 bit word counter. The least significant 9 lines, C0 through C8, count the words in each vertical line of blocks in the image (512), bits C9–C12 count the row lines within the block (16×16 bit block) and the remaining 9 address lines C13–C21, count the blocks in the horizontal direction of the image. Counter bits, C9–C12, are identical in value to the number of bits that the data must be shifted before loading, and therefore are used to control the shifter as well as address the buffer.

During read-out of an unrotated image these counter bits are used as shown in FIG. 3. C0–C8 are connected to A0–A8 of the memory devices and used to address the blocks in the vertical direction, C13–C21 are connected to A13–A21 of the memory devices and used to address the blocks in the horizontal direction, and C9–C12 are connected to A9–A12 and used to address the lines within the 16-blocks and also to control the shifter to shift the data back to its original position.

FIG. 4 shows the location of the data in the page buffer. As shown, the image is divided up into 16 line (in the horizontal direction) by sixteen bit (per word) blocks. For the first block, address lines A0–A8 and A13–A21 are all 0. For the second block in the scan line direction, the address lines A0–A8 equal 1 and the address lines A13–A21 equal 0. Within the block, individual words are addressed by address lines A9–A12.

During loading or reading of a non-rotated image in the prior art, each entire scan line of 512 words is completely read in or out before the next line is started. For a rotated image, the read-in is identical, but on read-out, the process reads out the same diagonal line from every block in the horizontal line of blocks before going on to the next diagonal line in all of the blocks in the same horizontal line, until all the diagonal lines in the 16-bit block are accessed. Then, the process reads out the diagonal lines from every block in the next set of 16-bit blocks in the horizontal direction. Therefore, for each random access memory (RAM), each consecutive read comes from a different row, and the slow page mode must be used. This entire prior art addressing system is shown in FIG. 5. The addressing lines A13–A21 of the memory devices for addressing the 16-bit blocks in the horizontal direction are taken from the counter C0–C8, and lines A0–A8 of the memory devices for addressing the 16-bit blocks in the vertical direction are taken from the counter C13–C21. Then, for each bit within the block, the address lines A9–A12 to each RAM device are a function of counter bits C9–C12. Here the process is to read out the same diagonal line, as defined by bits 9–12, in each of the 512 blocks in the horizontal direction before going on to the next diagonal line.

Figure 6:
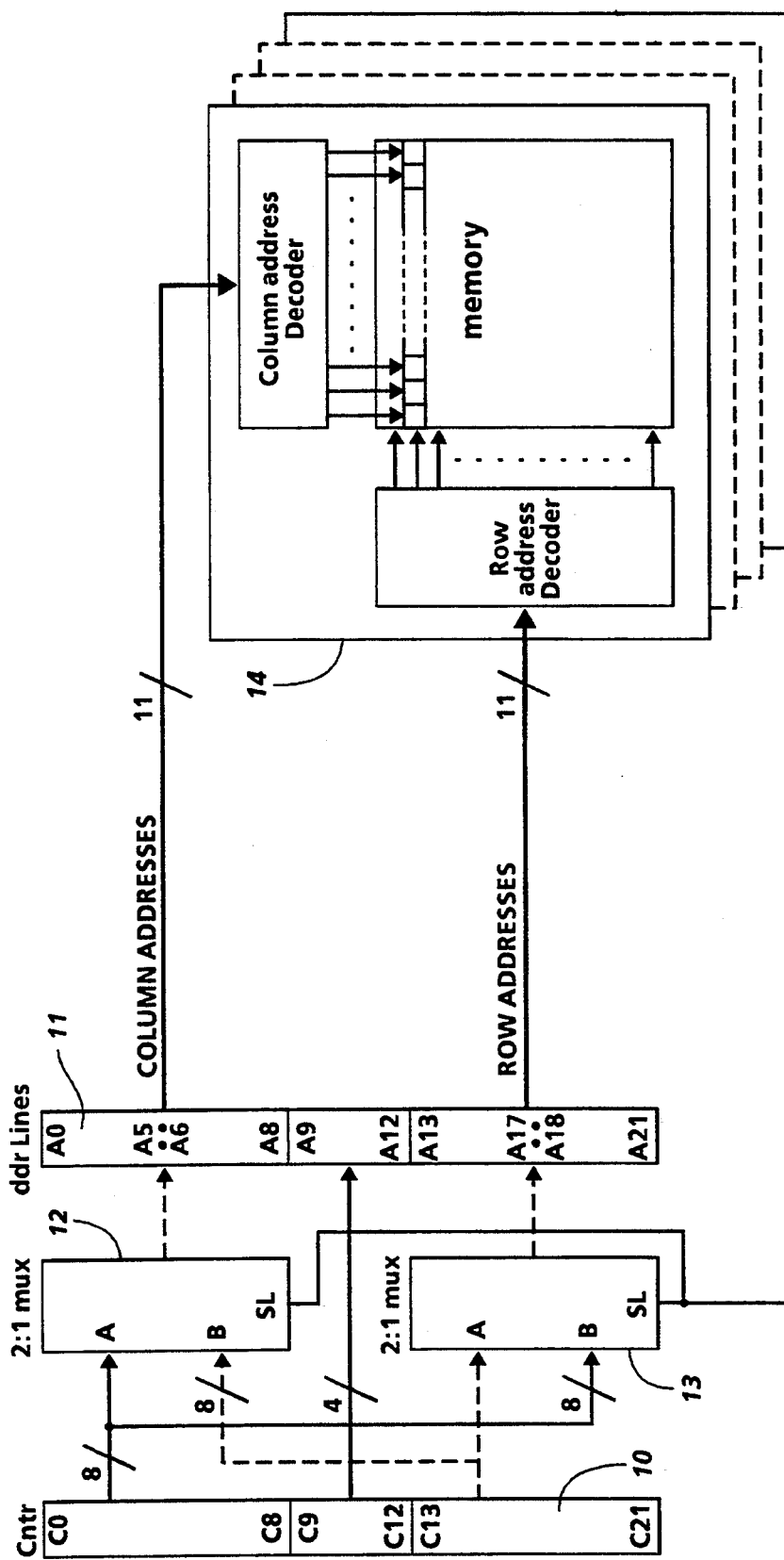
FIG. 6 is a simplified schematic diagram of the prior art circuit.

FIG. 6 is a the circuit of the prior art addressing arrangement shown in FIGS. 3 and 5. At this point is should be noted that while the image is 512 words by 8K bits, the memory is configured as 2K by 2K, which requires 11 address lines for row and column addresses. Therefore, for non-rotated images, bits C0–C10 are used for column addressing and C11–21 are used for the rows.

For rotated images, the multiplexers 12 13, as shown, couple bits C0–C8 to address lines A13–A21 and C13–C21 to address lines A0–A8. This effectively switches the read out from along the vertical direction to along the horizontal direction. However, as shown, the central 4 bits remain unchanged. These bits determine the line within the block, and this number does not change whether the read out is along a row or column. As described above, the read out for rotated images is in the horizontal direction (the counter increments the row address, A13–A21, once for each readout), and therefore must proceed at the slow page mode speed.

Figure 7:
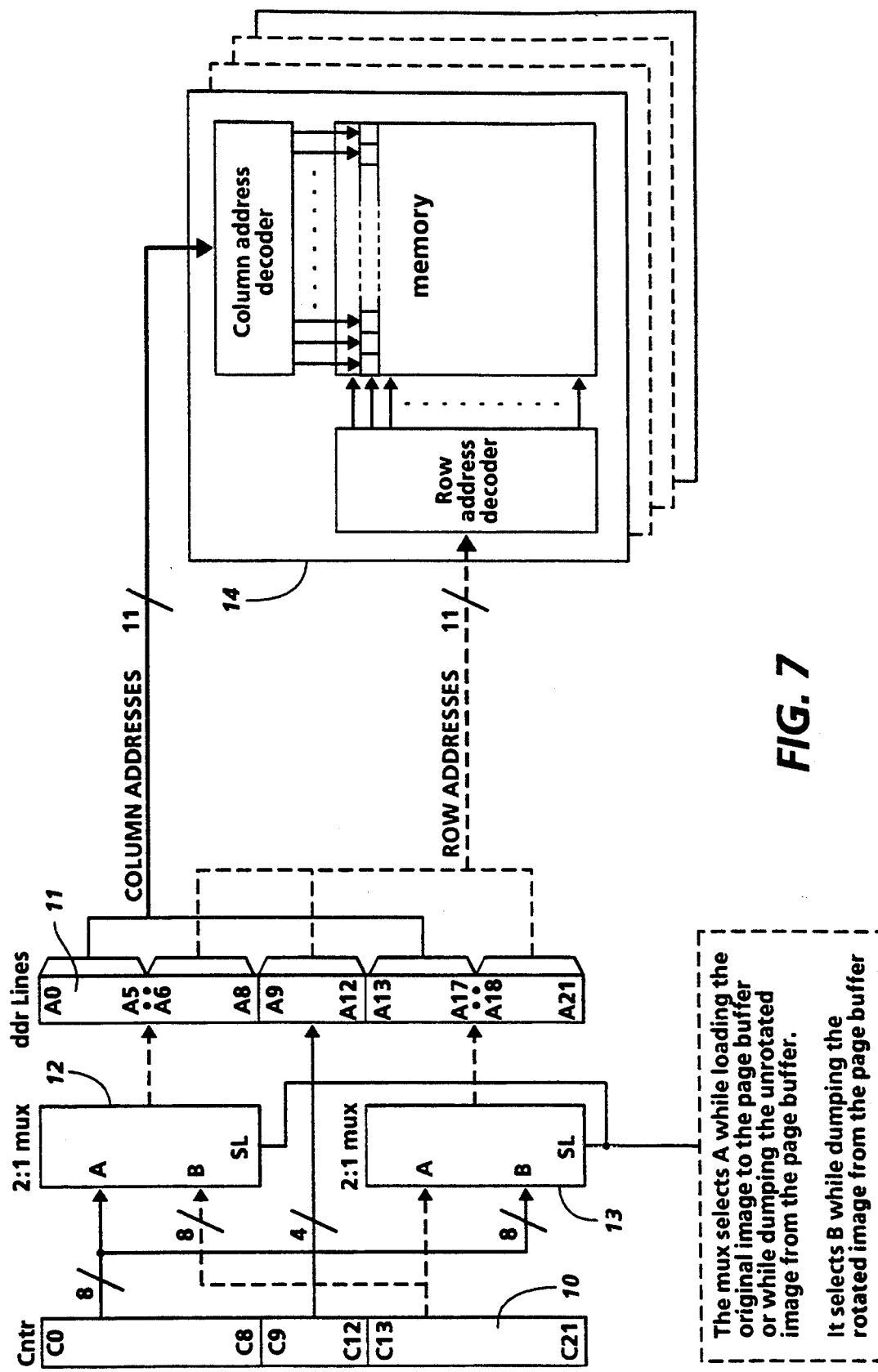
FIG. 7 is a simplified schematic diagram of the circuit of this invention.

FIG. 7 is the schematic diagram of the present invention. Here, the arrangement of the counter 10 and multiplexers 12 13 is identical to that of the prior art. However, the column address lines to the RAM are taken from bits A0–A5 and A13–A17 of the address line register 11 which are the least significant bits of the row and column counters. Therefore, there can be either 31 or 63 readouts along a row or column in the fast page mode before a slow page mode read out is required.

In terms of performance, if data can be accessed at the rate of 200 megabits/second (Mbits/sec) for an unrotated image using the fast page mode and 80 Mbits/sec for a rotated image not using the fast page mode, then, with this invention, data can be accessed at 191.3 Mbits/sec for an unrotated image, and at 183.8 Mbits/sec for a rotated image. Thus, with this invention, speeds approaching the fast page mode are available under all circumstances.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

We claim:

1. A circuit for addressing a random access memory (RAM) device having x address lines divided into two sets of address lines, column address lines and row address lines, comprising:

an x bit counter having y least significant bits, z most significant bits, and n intermediate bits, where $y+z+n=x$, said y and z bits being further divided into least significant bits and most significant bits, where x, y, z and n are positive integers, a first multiplexer having A and B inputs and an output, the A input coupled to said y bits, the B input coupled to said z bits, a second multiplexer having A and B inputs and an output the A input of said second multiplexer coupled to said z bits and the B input of said second multiplexer coupled to said y bits, and a register having $y+n+z$ input lines and output lines, the y least significant of said input lines of said register coupled to said output of said first multiplexer, the n intermediate input lines of said register coupled to said n intermediate bits of said counter and the z most significant of said input lines of said register coupled to said output of said second multiplexer, and having the least significant bits of said first and second multiplexer outputs coupled to said column address lines and having the most significant bits of said first and second multiplexer outputs coupled to said row address lines.

* * * * *